(12) United States Patent
MacArthur et al.

(10) Patent No.: US 6,347,378 B1
(45) Date of Patent: *Feb. 12, 2002

(54) TECHNIQUES AND CIRCUITS FOR HIGH YIELD IMPROVEMENTS IN PROGRAMMABLE DEVICES USING REDUNDANT LOGIC

(75) Inventors: James MacArthur, Santa Clara; Timothy Lacey, Cupertino, both of CA (US)

(73) Assignees: Quicklogic Corp., Sunnyvale; Cypress Semiconductor Corp., San Jose, both of CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/556,772

(22) Filed: Apr. 24, 2000

Related U.S. Application Data

(63) Continuation of application No. 08/662,054, filed on Jun. 12, 1996, now Pat. No. 6,148,390.

(51) Int. Cl.[7] .......................... G06F 1/32; G06F 11/20; G06F 11/14; H02H 3/05
(52) U.S. Cl. ...................... 713/310; 713/322; 713/323; 714/8; 714/11; 714/14; 714/22; 712/40
(58) Field of Search ............................. 712/37, 227, 2, 712/40, 11; 365/78, 789.12, 200, 210, 230.03, 230.05, 240; 714/1, 2, 8, 11, 721, 14, 22; 713/310, 323, 320, 324, 32, 330, 322, 340; 711/103, 173

(56) References Cited

U.S. PATENT DOCUMENTS

| | | | | |
|---|---|---|---|---|
| 4,630,241 A | * | 12/1986 | Kobayashi et al. | 365/200 |
| 4,633,439 A | * | 12/1986 | Harada et al. | 365/162 |
| 4,918,658 A | * | 4/1990 | Shah et al. | 365/227 |
| 5,005,158 A | * | 4/1991 | McClure et al. | 365/200 |
| 5,455,799 A | * | 10/1995 | McClure et al. | 365/201 |
| 5,498,975 A | * | 3/1996 | Cliff et al. | 326/10 |
| 5,502,649 A | * | 3/1996 | Hirata | 364/490 |
| 5,563,839 A | * | 10/1996 | Herdt et al. | 365/227 |
| 6,148,390 A | * | 11/2000 | MacArthur et al. | 712/37 |

* cited by examiner

Primary Examiner—Daniel H. Pan
(74) Attorney, Agent, or Firm—Wagner Murabito & Hao LLP

(57) ABSTRACT

A programmable logic device having redundant sets of logic blocks which are capable of being enabled or disabled. The programmable logic device includes a plurality of sets of logic blocks, a plurality of routing resources and a programming circuit. Good logic blocks are enabled and fully operational when programmed. Nonfunctional logic blocks are disabled, powered off and invisible to the programming software. Each set of logic blocks has a corresponding routing resource. The routing resource corresponding to an enabled set of logic blocks is capable of being configured to provide input and output data paths for the enabled set of logic blocks. The routing resource corresponding to a disabled set of logic blocks is capable of being configured to bypass the disabled set of the logic blocks. The programming circuit stores the configuration data for the routing resources and is capable of providing the configuration data to a routing resource that corresponds to an enabled set of logic blocks.

4 Claims, 5 Drawing Sheets

TECHNIQUES AND CIRCUITS FOR HIGH YIELD IMPROVEMENTS IN PROGRAMMABLE DEVICES USING REDUNDANT LOGIC

RELATED APPLICATION

This Application is a Continuation of commonly-owned U.S. patent application Ser. No. 08/622,054 filed Jun. 12, 1996, entitled "Techniques and Circuits for High Yield Improvement in Programmable Devices Using Redundant Logic" to MacArthur et al., U.S. Pat. No. 6,148,390.

FIELD OF THE INVENTION

The present invention relates generally to the field of integrated circuits. More particularly, the present invention relates to the field of programmable logic devices.

BACKGROUND OF THE INVENTION

Programmable logic devices (PLDs), sometimes referred to as PALs, PLAs, FPLAs, PLDs, FPLDs, EEPLDs, LCAs and FPGAs, allow the user to electrically program standard, off-the-shelf integrated circuit logic devices to meet the specific needs of his/her particular application. Thus, proprietary and standard logic functions can be designed and fabricated in-house by using programmable logic devices without the long engineering lead times, the high tooling costs, and the complex procurement and inventory issues associated with application specific integrated circuits (ASIC) devices.

Such programmable logic devices include a plurality of logic blocks that may be user configurable and are interconnected via a programmable interconnect structure. The plurality of logic blocks, often referred to as macrocells, are typically arranged in an array or matrix structure. By interconnecting the logic blocks via the interconnect structure, the programmable logic device can be programmed to perform complex logic functions.

Interconnect structures having a plurality of horizontal and vertical routing lines are typically arranged in a grid-like structure. The routing lines are metal lines or wires (or other conductive materials) that carry signals to and from the used logic blocks. Located at every or almost every interconnect point of a horizontal routing line and a vertical routing line is a programmable element that creates a cross-link when programmed and located at every or almost every interconnect point of two horizontal routing lines or two vertical routing lines is a programmable element that creates a pass-link when programmed. The cross-link is used to either couple or decouple the horizontal and vertical routing lines at an interconnect point while the pass-link is used to either couple or decouple two segments of a routing line. The programmable elements may be fuses or antifuses which can be programmed to respectively connect or disconnect the routing lines at the interconnect point. It is appreciated that other types of programmable elements may be used as well such as Static Random Access Memories (SRAMs) and flash Electrically Erasable Programmable Read-Only Memories (EEPROMs). It is also appreciated that the various programmable elements may be used in various parts of a PLD such as the macrocells, product term matrix, and the "OR" term array.

A fuse is a device having two electrodes and a conductive element which electrically connects the two electrodes. When a fuse (of one embodiment) is programmed, by passage of sufficient current between its electrodes, the two electrodes are electrically disconnected. Laser fuses are programmed by using a laser to disconnect the electrodes. By contrast, an antifuse is a device having two electrodes which are not electrically connected when unprogrammed. However, when programmed, the first and second electrodes of the antifuse are permanently electrically connected. An antifuse (of one embodiment) is programmed by applying sufficient voltage ("programming voltage") between its first and second electrodes, thereby forming a bi-directional conductive link between the first and the second electrodes.

In order to program a programmable logic device, the user inputs a logic circuit design into a computer using one of a variety of design entry options. Possible design entry options include hierarchical schematic capture, a hardware description language, Boolean equations, state machine diagrams, truth table, netlist, and microcoded assembly language. After the logic circuit design is entered into the computer, the computer maps the logic circuit design into the programmable logic device in order to implement the logic circuit design when programmed. During programming, a path is routed through the interconnect structure by selectively programming the programmable elements at each interconnect point of the routing lines in the path. In other words, the used logic blocks are coupled to the interconnect structure by programming programmable elements such that the appropriate voltage signals can be applied to the input/output ports of each selected logic block.

During the manufacturing and testing of a programmable logic device, the device may be found to have defective logic. If the programmable element is a one-time programmable device such as a fuse or antifuse, a routing failure due to a bad logic block may cause the entire programmable logic device to be defective. This type of failure often requires the user to dispose of the device. However, if alternative logic blocks that can be utilized by the programming software are available to correct such a defect, the programmable logic device is functional despite such failures. In the past, unused redundant routing resources and/or logic blocks were available in some programmable logic devices but there was no way for the programming software to utilize these redundant elements. Therefore, to reduce the probability of producing defective programmable logic devices, it is desirable to provide a programmable logic device having redundant logic blocks that can be utilized by the programming software.

SUMMARY OF THE INVENTION

The present invention provides a method and apparatus for high yield improvements in programmable logic devices using redundancy. The present invention describes a programmable logic device having redundant logic blocks which are capable of being enabled or disabled. The programmable logic device includes a plurality of logic blocks, a plurality of routing resources and a programming circuit. At least one routing resource corresponds to a logic block. When a logic block is enabled, its corresponding routing resource is capable of being configured to provide input and output data paths to the enabled logic block and when a logic block is disabled, its corresponding routing resource is capable of being configured to bypass the disabled logic block. The programming circuit is capable of storing configuration data and is capable of providing the configuration data to the routing resources that correspond to an enabled set of logic blocks.

The present invention also concerns a method for programming a programmable logic device having redundant sets of logic blocks. At least one of the functional sets of logic blocks is enabled for programming and at least one of the nonfunctional sets of logic blocks is disabled from programming. Each routing resource that corresponds to a functional set of logic blocks is configured to provide its corresponding functional set of logic blocks with input and output data paths.

It is desirable in certain embodiments to provide a programmable logic device that has the software capability to program around a bad or nonfunctional logic block or row/column of logic blocks. By making the bad logic blocks appear transparent, only the functional logic blocks are visible to the programming software. Therefore, programming is simplified by having the software program only the functional logic blocks without attempting to program the nonfunctional logic blocks and not taking the nonfunctional logic blocks into account when programming the functional logic blocks.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE PRESENT INVENTION

The following detailed description sets forth embodiments in accordance with the present invention that use various redundancy techniques to improve the yields of programmable logic devices and methods of making and using the same. In the following description, details are set forth (such as specific circuitry configurations) in order to provide a thorough understanding of the present invention. It will be evident, however, that the present invention may be practiced other than as specifically described herein. In other instances, the functioning of well-known circuit components, logic gates, etc., have not been described in particular detail so as not to obscure the present invention.

The present invention concerns methods and apparatuses for incorporating redundancy into programmable logic devices. According to one embodiment of the present invention, redundancy may be implemented by providing redundant sets of logic blocks such that a nonfunctional set of logic blocks can be replaced with an unused, alternative functional set of logic blocks. Furthermore, each set of logic blocks can be enabled or disabled to respectively power "on" or "off" the set of logic blocks.

Figure 1:
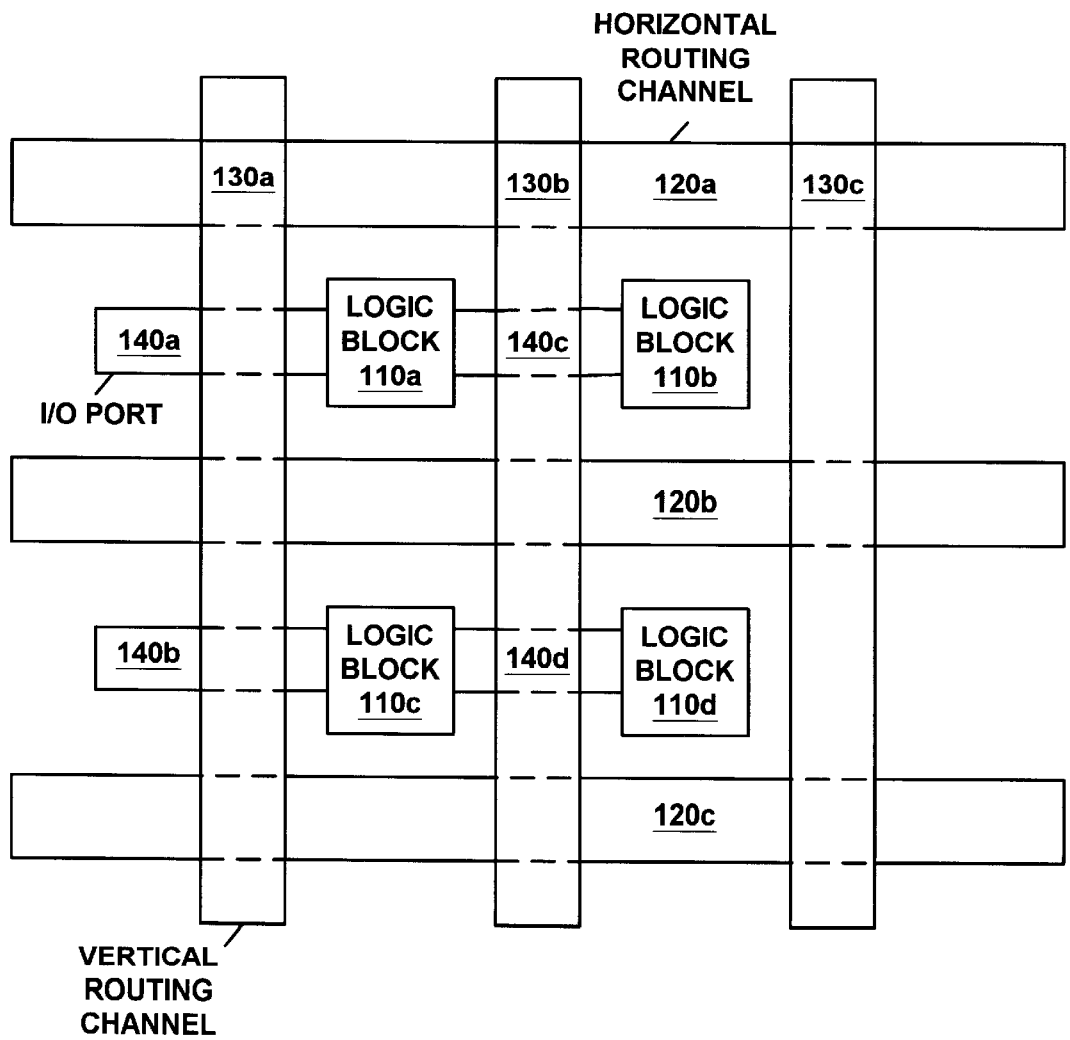
FIG. 1 is an illustration of a conventional programmable logic device.

FIG. 1 illustrates a block diagram of a typical programmable logic device 100 having logic blocks 100a–100d arranged in an array structure with horizontal routing channels 120a–120c and vertical routing channels 130a–130c forming the interconnect structure. Each horizontal routing channel 120a–120c has a plurality of horizontal routing lines and each vertical routing channel 130a–130c has a plurality of vertical routing lines. The interconnect structure is coupled to the array of logic blocks 110a–100d via input/output ports 140a–140d. The input/output ports 140a–140d may include a plurality of horizontal and/or vertical routing lines.

Figure 2:
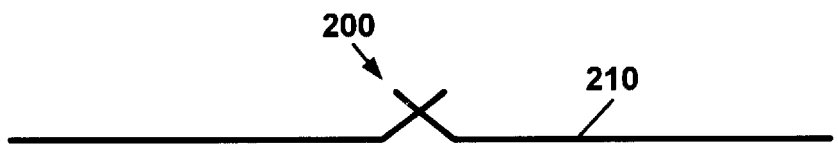
FIG. 2 is an illustration of a conventional antifuse programmable element.

At one or more (preferably every or almost every) interconnect point of two routing lines or two segments of a routing line is a programmable element. An interconnect point is the intersection between (a) a horizontal and a vertical routing line, (b) two horizontal routing lines, or (c) two vertical routing lines. FIG. 2 illustrates a typical programmable element that includes a single antifuse device 200 coupled to the routing line 210. It is appreciated that other types of programmable elements can be used such as SRAM, EEPROM, Flash, or fuses. When the programmable element at the intersection of a horizontal and a vertical routing line is programmed, a cross-link between the routing lines is formed. Likewise, when the programmable element at the intersection of two segments of a horizontal routing line or two segments of a vertical routing line is programmed, a pass-link is formed. An intersection between two routing lines may also be referred to as a node. In order to program the antifuse device 200, a high voltage Vpp is applied to one end of the routing line 210 and a low voltage or ground is applied to the other end of the routing line 210.

Figure 3:
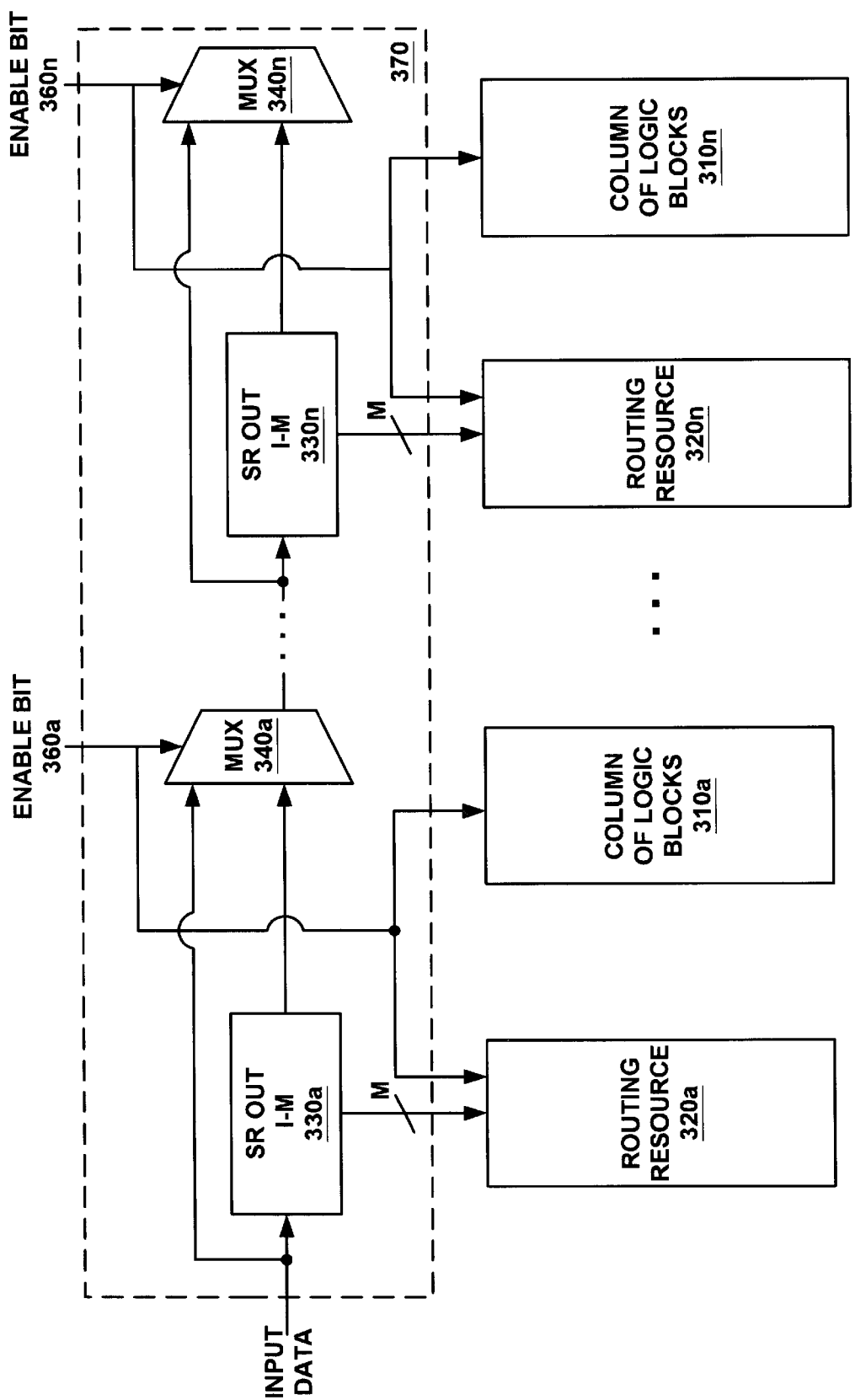
FIG. 3 is an illustration of one embodiment of the present routing configuration bypass circuit having redundant columns of logic blocks.

The present invention provides a method and apparatus for high yield improvements in programmable logic devices using redundancy. FIG. 3 shows a block diagram of one embodiment of a routing configuration bypass circuit 300 which incorporates redundant sets of logic blocks. Each set of logic blocks may be a single logic block, a row or a column of logic blocks, or some other grouping of logic blocks. Although FIG. 3 specifically illustrates an embodiment having redundant columns, an alternative embodiment may have redundant rows.

FIG. 3 illustrates a plurality of logic blocks 310a–310n, a corresponding plurality of routing resources 320a–320n, a corresponding plurality of enable bits 360a–360n and a programming configuration circuit 370. According to FIG. 3, each column of logic blocks is coupled to a corresponding enable bit which is stored in a register (not shown). Each enable bit may be programmed to provide either a logic "high" or logic "low" voltage signal to one of the columns of logic blocks 310a–310n. In one embodiment, a logic "high" signal enables its corresponding column of logic blocks and a logic "low" signal disables its corresponding column of logic blocks. According to FIG. 3, the enable bit 360a provides an enable signal to the column of logic blocks 310a and the enable bit 360n provides an enable signal to the column of logic blocks 310n.

The routing resources in the routing configuration bypass circuit 300 are shown by blocks 320a–320n. In one embodiment, a routing resource includes a plurality of routing lines, a plurality of programmable elements and a routing channel bypass circuit (see the discussion of FIG. 5).

According to FIG. 3, each routing resource corresponds to a column of logic blocks such that the routing resource 320a corresponds to the column of logic blocks 310a and the routing resource 320n corresponds to the column of logic blocks 310n.

Each routing resource is enabled or disabled by a corresponding enable bit. Note that the enable signal received by a routing resource is the same enable signal received by its corresponding column of logic blocks. Therefore, when the column of logic blocks 310a is enabled by the enable bit 360a, the routing resource 320a may also be enabled by the enable bit 360a and when the column of logic blocks 310a is disabled by the enable bit 360a, the routing resource 320a may also be disabled by the enable bit 360n. Similarly, the column of logic blocks 310n and the routing resource 320n may both be enabled or disabled by the enable bit 360n.

Typically, when a column of logic blocks is functional, then its corresponding routing resources may be enabled and when a column of logic blocks is nonfunctional, then its corresponding routing resources may be disabled. An alternative or redundant functional column of logic blocks may also be disabled. When a routing resource is enabled, he column of logic blocks that corresponds to the enabled routing resource may be configured by having its selected inputs and outputs coupled to the interconnect structure. On the other hand, when a routing resource is disabled, the horizontal routing lines in the disabled routing resource may be configured to pass through the corresponding column of logic blocks as though they do not exist.

The routing configuration bypass circuit 300 also includes a programming configuration circuit 370 for providing the configuration data to the routing resources. The programming circuit includes a plurality of shift registers 330a–330n and a plurality of multiplexers or decoders 340a–340n. Each shift register stores the configuration data used to program the routing resource for a corresponding column of logic blocks. Therefore, the shift registers 330a–330n are also referred to as configuration shift registers. For example, the shift register 330a stores the configuration data used for programming the routing resource 320a that corresponds to the column of logic blocks 310a. Similarly, the shift register 330n stores the configuration data used for programming the routing resource 320n that corresponds to the column of logic blocks 310n.

The configuration shift registers may be coupled together to form a chain of configuration shift registers. Each individual configuration shift register may be individually included or excluded from the chain of shift registers. For example, when a column of logic blocks and its corresponding routing resource are enabled by an asserted enable bit (e.g. logic "high" voltage level), the configuration shift register corresponding to the enabled column of logic blocks is included in the chain of configuration shift registers. On the other hand, when a column of logic blocks and its corresponding routing resource are disabled by a deasserted enable bit (e.g. logic "low" voltage level), then the configuration shift register corresponding to the disabled column of logic blocks is excluded from the chain of configuration shift registers. In this scenario, the programming of resources of a disabled column of logic blocks is overridden. Therefore, during programming, only the configuration data stored in the chain of configuration shift registers may be used to configure or program the routing resources of the programmable logic device.

According to FIG. 3, the input of the shift register 330a is coupled to an input of the programmable logic device to receive the configuration data. The output of the shift register 330a is coupled to a first input of the multiplexer 340a. The multiplexer 340a also has a second input that is coupled to the input of shift register 330a and a select input coupled to an enable bit 360a.

In one embodiment, when the enable bit 360a is a logic "1", it provides a high voltage signal to the select input of multiplexer 340a. The multiplexer 340a then selects its first input, which is coupled to an output of the shift register 330a. The shift register 330a then provides configuration data via the outputs $OUT_{1-m}$ to the routing resource 320a.

On the other hand, when the enable bit 360a is a logic "0", it provides a low voltage signal to the select input of multiplexer 340a. The multiplexer 340a selects its second input which is coupled to the input of the shift register 330a. When the second input of the multiplexer 340a is selected, the shift register 330a is bypassed such that the configuration data stored in the shift register 330a is not used to program the routing resource 320a.

Similarly, the enable bit 360n provides an enable signal to the select inputs of multiplexers 340n to select between the first and second inputs of the multiplexer 340n. When the first input of the multiplexer 340n is selected, the shift register 330n is included in the chain of configuration shift registers. However, when the second input of the multiplexer 340n is selected, the shift register 330n is not included in the chain of configuration shift registers.

In the event the column of logic blocks 310a is a defective column (e.g., it includes one or more bad or nonfunctional logic blocks), then the programmable logic device may be programmed to bypass the column of logic blocks 310a. As described above, the enable bit 360a determines whether or not a particular column of logic blocks is disabled or enabled. In the event the column of logic blocks 310a is defective, by disabling the defective column 310a and configuring its routing resource 320a to bypass it, the defective column 310a consumes negligible power. Furthermore, by disabling defective column 310a, the software treats the defective column 310a as if it were masked out from the programmable logic device. Therefore, as a further advantage of the present invention, the programming software may be simplified when nonfunctional columns of logic blocks appear transparent.

Furthermore, if the column of logic blocks 310n is a redundant column (i.e. one which is structurally similar or identical to other logic blocks in the set [e.g., 310a], but not originally selected for programming) then column 310n can be used as a replacement for column 310a. In this scenario, column 310n may be enabled by providing a "high" voltage signal to the column 310n and the routing resource 320n. Furthermore, the column 310a may be disabled by providing a "low" voltage signal to the column 310a and the routing resource 320a. In an alternative embodiment, the routing resources may be enabled with a "low" voltage signal and disabled with a "high" voltage signal. Thus, the column 310n may be programmed while column 310a is made transparent.

It may be desirable to turn "off" defective columns of logic blocks to prevent the defective columns from drawing current and therefore consuming unnecessary power. Furthermore, by turning "off" a defective column of logic blocks, the defective column of logic blocks appears transparent to the programming software. In other words, the programming software may treat a defective column of logic blocks as if it does not exist. Consequently, the programming software can be designed such that it is primarily (and preferably only) concerned with programming the functional columns of logic blocks. Slight modifications to the interconnect structure in the programmable logic device can be easily implemented to allow for redundant logic blocks by providing an enable circuit for the individual logic blocks, rather than a set of logic blocks.

Figure 4:
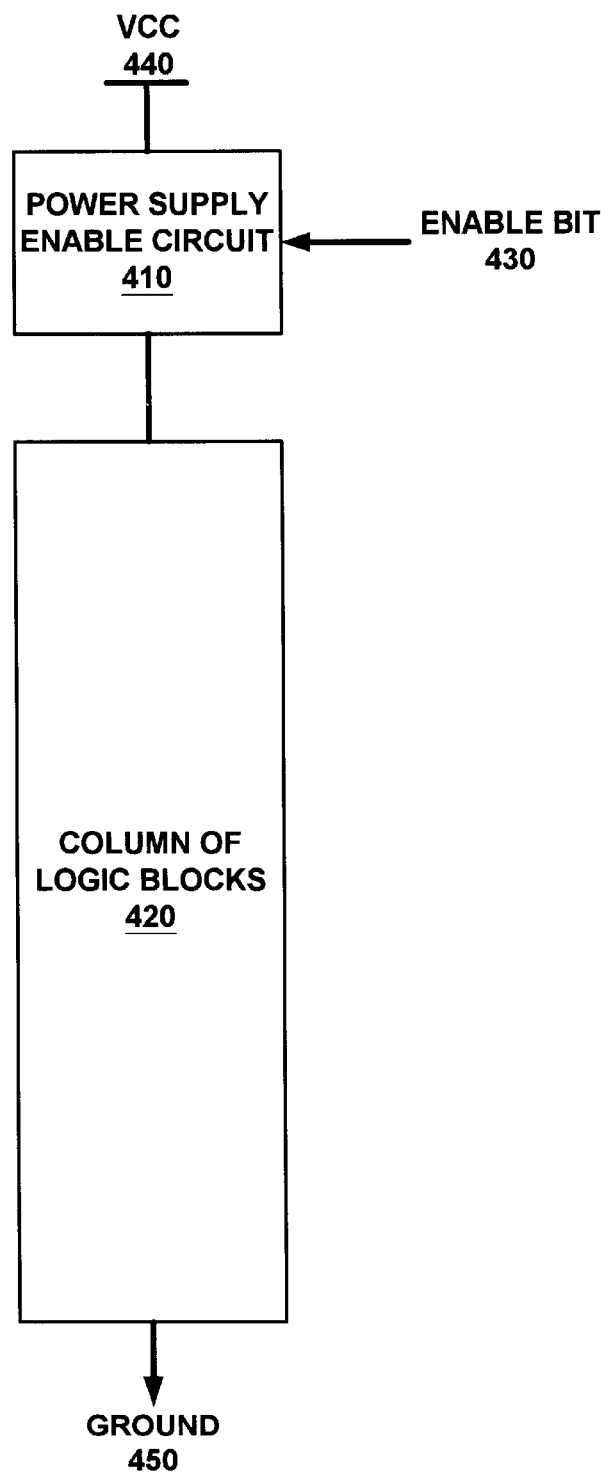
FIG. 4 illustrates one embodiment of the present power disable circuit for a column/row of logic blocks.

FIG. 4 illustrates a power disable circuit 400 for a column or row of logic blocks. The power disable circuit 400 corresponds to each of boxes 310a and 310n in FIG. 3. According to FIG. 4, the power disable circuit 400 includes a power supply enable circuit 410 and a column of logic blocks 420. The circuit 400 is coupled to Vcc at 440 and to ground at 450. Furthermore, the power supply enable circuit is coupled to an enable bit 430 (similar to enable bit 360a) which controls whether or not the set of logic blocks 400 is powered "on" or "off". For example, if the enable bit is asserted and provides a "high" voltage signal to the power supply enable circuit 410, then power is supplied to the column of logic blocks 420. Column 420 then acts as part of the logic array in the programmable logic device. On the other hand, if the enable bit 430 is deasserted and provides a "low" voltage signal to the power supply enable circuit 410, then the column of logic blocks 420 is turned "off" and is not a functional part of the logic array in the programmable logic device.

In one embodiment, each enable circuit is a MOS transistor having its drain terminal coupled to Vcc, its source terminal coupled to the columns of logic blocks 420 and its gate terminal coupled to the enable bit 430. The enable circuit may also be implemented with a fuse/antifuse device or some other type of switching device.

The power disable circuit in FIG. 4 provides the ability to individually turn "on" and "off" the power in each set of logic blocks in the logic array. Therefore, during the testing of a programmable logic device, a particular set of logic blocks can be isolated by enabling it and disabling all other sets of logic blocks. When a particular set of logic blocks is isolated, the power consumption (e.g. Icc current) can be measured for that particular set of logic blocks to determine whether the particular set of logic blocks is functioning properly. In other words, the enable bits allows for the failure analysis of Icc problems within a row or column of logic blocks. By isolating each set of logic blocks, the nonfunctional sets of logic blocks can be detected and replaced by an alternative unused or redundant set of logic blocks. Doing so for additional (and preferably each) set logic of blocks, leads to an increased probability that the programmable logic device will be considered a "good" device.

Figure 5:
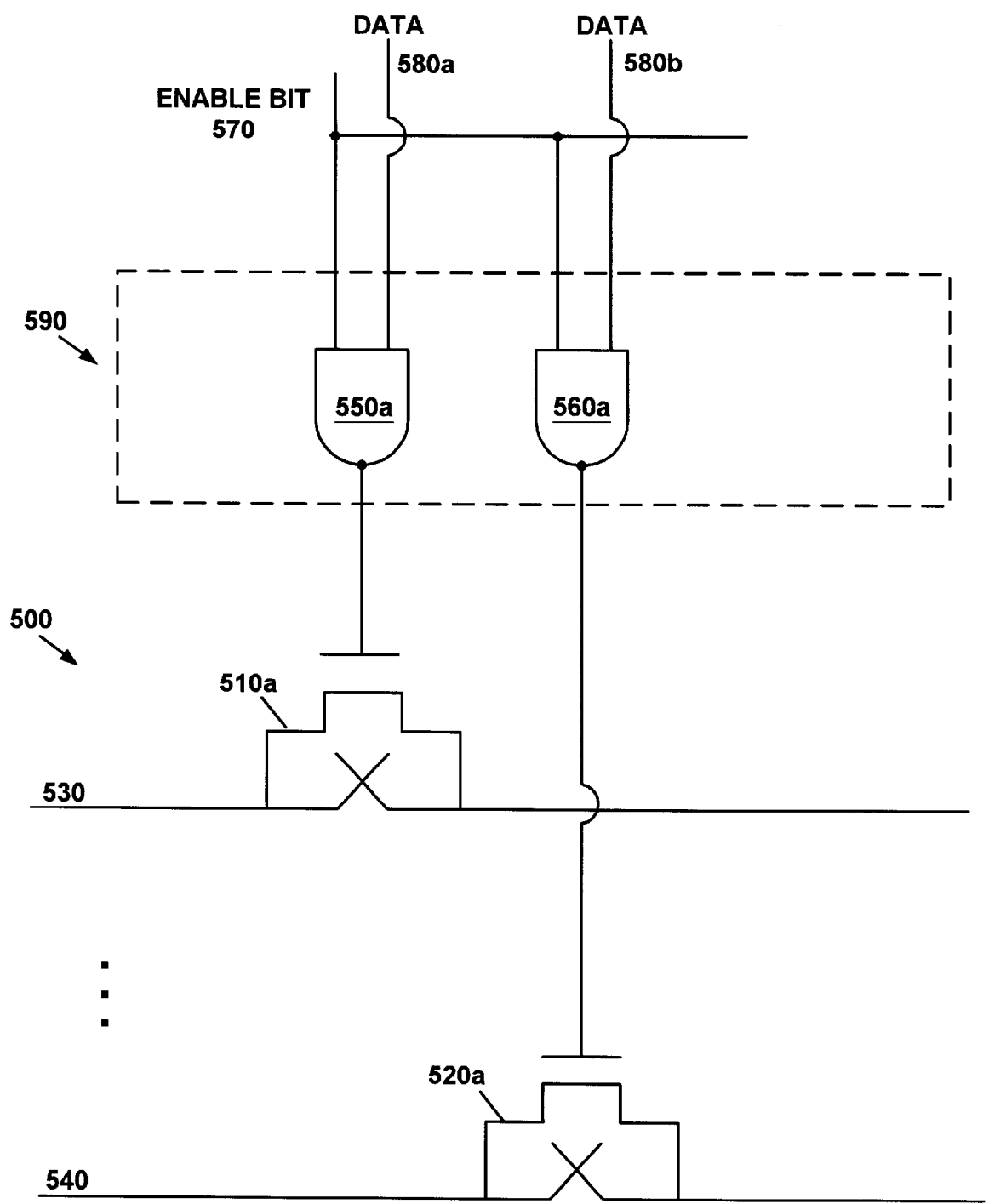
FIG. 5 illustrates one embodiment of the present routing channel bypass circuit.

Each of the routing resources 320a–320n in FIG. 3 may include a plurality of routing lines, a plurality of programmable elements, and a routing channel bypass circuit. FIG. 5 is a detailed illustration of a portion of one of the redundant routing resources 320a–n in FIG. 3. The routing resource 500 includes a horizontal routing line 530 coupled to the programmable element 510a and a horizontal routing line 540 coupled to a second programmable element 520a. Although the programmable elements 510a and 520a as shown include a transistor coupled to an antifuse device, it is appreciated that other types of programmable elements may be used in the present invention. The routing resource 500 also includes the routing channel bypass circuit 590. In one embodiment, the routing channel bypass circuit 590 includes a plurality of NAND gates each having a first input coupled to a register for receiving the enable bit 570 and a second input coupled to an output of a shift register for receiving configuration data 580a and 580b.

The programmable elements 510a and 520a shown in FIG. 5 are each coupled to a corresponding NAND gate. In other words, the programmable element 510a is coupled to the NAND gate 550a and the programmable element 520a is coupled to the NAND gate 560a. When a NAND gate receives an asserted enable bit 570 (e.g. a "high" voltage signal), the configuration data received by the NAND gate is used to program the programmable element, Therefore, in one embodiment, if the configuration data received by the programmable element is a logic "0", the programmable element is selected for programming but if the configuration data received by the programmable element is a logic "1", the programmable element is deselected for programming. On the other hand, when the NAND gate receives a deasserted enable bit 570 (e.g. a "low" voltage signal), the programmable element is always deasserted. Therefore, the routing channel bypass circuit 590 ensures that when a set of logic blocks is disabled by an asserted enable bit 570, then the corresponding horizontal routing resource is continuous through the logic block to the next logic block in the next column, and when a set of logic blocks is enabled by an asserted enable bit 570, then the corresponding routing resource is enabled for configuration via the configuration shift register.

The programming aspect of the present invention may be conveniently implemented using a conventional general purpose digital computer programmed according to the teachings of the present specification, as will be apparent to those skilled in the relevant art(s). Appropriate software coding can readily be prepared by skilled programmers based on the teachings of the present disclosure, as will be apparent to those skilled in the relevant art(s).

The present invention may also be implemented by the preparation of application specific integrated circuits or by interconnecting an appropriate network of conventional component circuits as described herein, modifications of which will be readily apparent to those skilled in the relevant art(s).

The present invention thus also includes a computer program product which may comprise a storage medium including instructions which can be used to program a computer to perform a process according to the present invention. The storage medium can include, but is not limited to, any type of disk including floppy disks, optical disks, CD-ROMs, and magneto-optical disks, ROMs, RAMs, EPROMS, EEPROMs, magnet or optical cards, or any type of media suitable for storing electronic instructions.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regard in an illustrative rather than a restrictive sense.

We claim:

1. A programmable logic device comprising:
   a plurality of logic blocks, wherein at least one logic block is capable of being powered on and capable of being powered off if said at least one of logic block is nonfunctional to prevent the nonfunctional logic block from drawing substantial current.

2. The programmable logic device of claim 1, further comprising:
   a plurality of routing resources, each routing resource coupled to a corresponding logic block, said routing resources capable of being configured to bypass said nonfunctional logic path.

3. A method for programming a programmable logic device having redundant sets of logic blocks, comprising:
   powering on at least one functional set of logic blocks; and
   powering off at least one nonfunctional set of logic blocks, if present, thereby preventing said at least one nonfunctional set of logic blocks from drawing substantial current.

4. The method of claim 3, further comprising configuring routing resources to bypass said nonfunctional set of logic blocks, if present.

* * * * *